(12) United States Patent
Montagnana (10) Patent No.: US 6,825,702 B2
(45) Date of Patent: Nov. 30, 2004

(54) METHOD AND CIRCUIT OF LOCKED CONDITION DETECTION FOR PLL

(75) Inventor: Marco Montagnana, Cormano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/351,282

(22) Filed: Jan. 24, 2003

(65) Prior Publication Data
US 2003/0179024 A1 Sep. 25, 2003

(30) Foreign Application Priority Data
Jan. 25, 2002 (IT) .................................. VA2002A0006

(51) Int. Cl.[7] .............................................. H03L 7/06
(52) U.S. Cl. ..................................... 327/156; 327/160
(58) Field of Search ................................ 327/156, 147, 327/150, 151, 159, 160; 331/DIG. 2

(56) References Cited

U.S. PATENT DOCUMENTS 5,710,525 A * 1/1998 Tanaka et al. ................. 331/16
6,023,198 A * 2/2000 McKinney et al. ........... 331/17

* cited by examiner

Primary Examiner—Timothy P. Callahan
Assistant Examiner—Cassandra Cox
(74) Attorney, Agent, or Firm—Lisa K. Jorgenson; Allen, Dyer, Doppelt, Milbrath & Gilchrist, P.A.

(57) ABSTRACT

A digital circuit for detecting a phase lock condition of a phase locked loop (PLL) circuit includes a pair of counters respectively receiving a digital signal produced by the PLL circuit, and a digital reference signal that is also received by the PLL circuit. A digital comparator is connected to the pair of counters for comparing count values contained therein at an end of a counting cycle, and for generating a first logic signal when the count values are the same and a second logic signal when the count values are different. A resettable memory receives the logic signals generated by the digital comparator and has a capacity sufficient to store a plurality of the logic signals resulting from successive comparisons. The resettable memory generates a third logic signal for asserting a phase lock condition of the PLL circuit when an uninterrupted sequence of the first logic signals have been input to the resettable memory during the successive comparisons, and generates a fourth logic signal for asserting a loss of a phase lock condition of the PLL circuit when an uninterrupted sequence of the second logic signals have been input to the resettable memory during the successive comparisons.

31 Claims, 5 Drawing Sheets

METHOD AND CIRCUIT OF LOCKED CONDITION DETECTION FOR PLL

FIELD OF THE INVENTION

The present invention relates to integrated digital systems, and in particular, to a circuit for generating a clock signal from a frequency stable reference signal. More specifically, the invention relates to a phase-locked loop (PLL) for generating a clock signal at a frequency that is generally higher than the reference frequency.

BACKGROUND OF THE INVENTION

Phase-locked loops (PLL) are increasingly used in digital systems integrated on silicon for generating a clock signal. Starting from a stable external reference signal generated by a quartz crystal or a ceramic resonator) having a relatively low frequency, the PLL provides to the integrated system a highly stable clock signal, at a frequency higher than that of the reference signal. Very often the frequency value may be readily programmed. From the same reference it is possible to obtain different clock frequencies simply by reprogramming the characteristics of the loop.

The use of a PLL for generating a synchronization signal and/or a relatively high frequency clock signal allows a reduction of electromagnetic emissions at the system level. This results in a savings of additional components used for filtering or noise suppression.

In electronic applications, particularly when exposed to high noises levels and in which the stability of the timing signal is fundamental for the functioning of digital electronic circuits, the control of the state of the phase-locked loop is very important. The output signal of the PLL is considered locked to the reference signal when the ratio between the respective frequencies (the reference input signal and the output signal from the PLL) is kept constant.

Stability is ensured by the architecture of the phase-locked loop, which implements a negative feedback loop used for detecting any temporary shift of the frequency of the output signal from the expected value. This information is reentered as quickly as possible. The parameters of the circuit are automatically varied in order to align again the two signals according to the desired frequency ratio.

Figure 1:
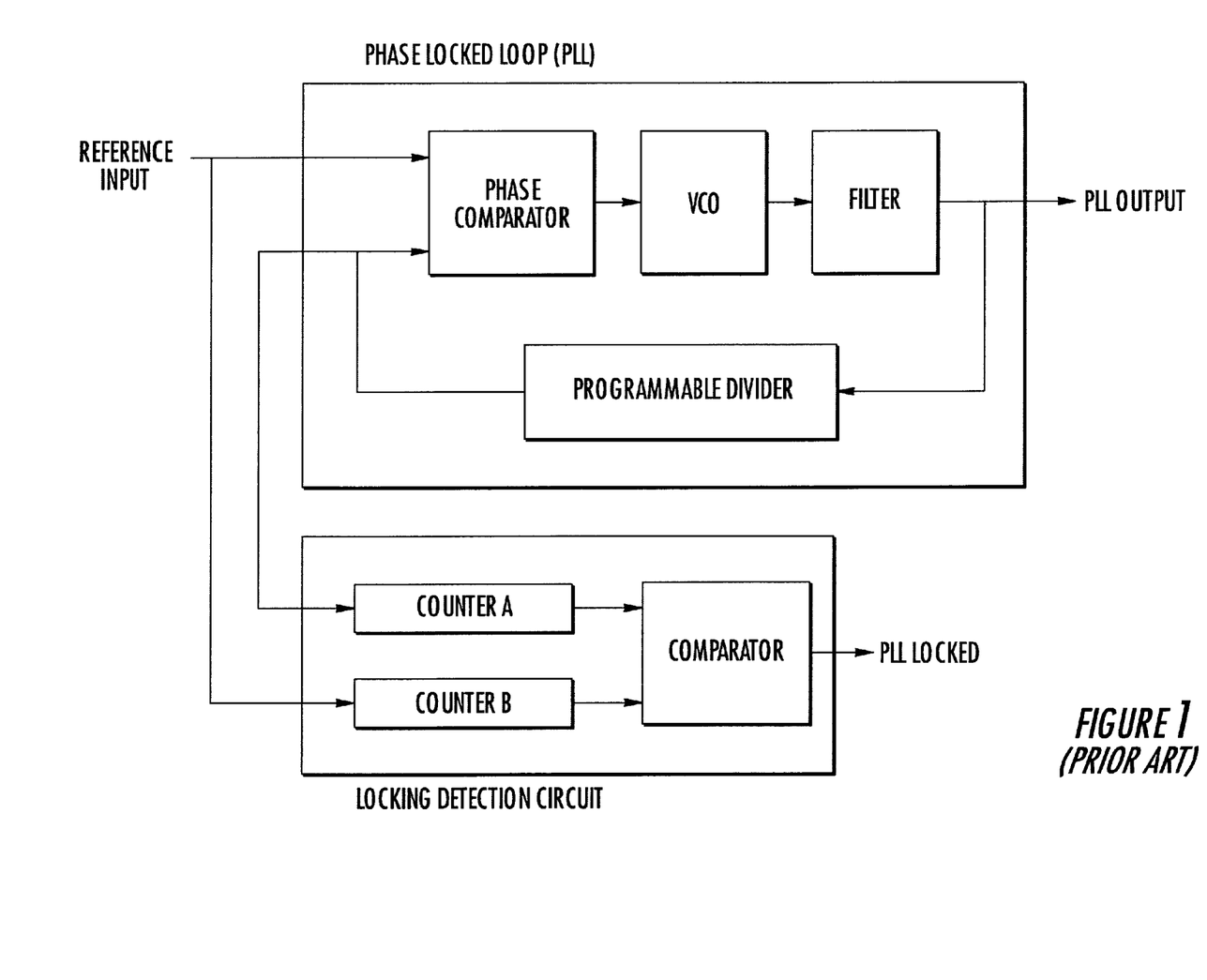
FIG. 1 is a basic diagram of a phase-locked loop (PLL) having a lock detection circuit according to the prior art.

Electronic devices used in different applications (for instance in automotive, aeronautics, etc.) are subject, during functioning, to particularly high noise levels that disturb analog circuits such as the PLL. These disturbances often cause loss of the locked condition, to which the PLL reacts in long response times. This reaction depends on the architecture and the parameters of the loop, i.e., characteristics of the filter. A block diagram of a typical analog phase-locked loop is depicted in FIG. 1 (VCO stands for Voltage Controlled Oscillator).

The presence of an auxiliary circuit for verifying the locked condition of the PLL becomes indispensable in the above mentioned situations. This is because the system must have the possibility of reacting properly whenever the noise reaches a level such that the execution of the functions required from the integrated device may be in jeopardy, or, even worse, an incorrect functioning may occur at the system level compromising safety. For instance, in the automotive field safety is very important in airbag electronic controls and in the ABS.

An important problem to be solved in defining the architecture of such a monitoring circuit is to strike the best compromise between the requirement of adequate sensitivity in detecting the locked condition or the loss of it, and that of filtering out momentary loss of locking that are not significant for a correct functioning of the system.

In general the following criteria are defined:

Detection of a Locked Condition:

The system is defined as locked when such a condition remains stable in time. Overshoots in reaching a phase-locked state could be misinterpreted as if the locked condition had been reached. It may just be a temporary coincidence that the successive detection may not be confirmed causing an anomalous functioning of the system. For example, exceptions and/or interrupts may be generated, emergency and/or resume routines may start, and the like.

Detection of a Loss of Locking:

Desirably, the system should filter events having a loss of locking with a very short duration, and signal only persistent losses of locking. This later allows emergency and resume routines to be started only when they are really necessary. This avoids causing false functioning exceptions at any minimal noise injection.

The above mentioned conditions are particularly relevant when the circuit for monitoring the locked condition is digital, wherein the stochastic effects relative to the conditions that occur at the instant in which the decision is taken (PLL locked or not) have a fundamental role. A digital circuit is intrinsically more robust than an equivalent analog circuit, and therefore more suitable in case of particularly noisy environments.

Referring to the basic diagram of FIG. 1, a typical digital approach contemplates implementation of two counters respectively driven by the two signals to be compared in frequency, that is, the reference signal (input signal of the PLL) and the output signal (properly divided) that is fed-back to the input to the analog comparator circuit of the PLL (Phase Comparator). When one of the two counters reaches the end count value, the instantaneous contents of the two counters are compared, producing the result. If the two counters are aligned, the PLL is assumed to be locked, and vice-versa. Any difference between the compared values of the two counters is considered to verify an absence of a locking condition. There are drawbacks that are often unacceptable for applications particularly exposed to noise, and where safety has a fundamental role.

False Detection of a Locked Condition:

When the circuit is turned on, during an initial transient period, the PLL generates an output signal that approximates as much as possible the steady state value, defined by the ratio between the reference frequency and the set multiplication factor. The greater the speed of the circuit, the larger the overshoots in frequency about the expected value.

Figure 2:
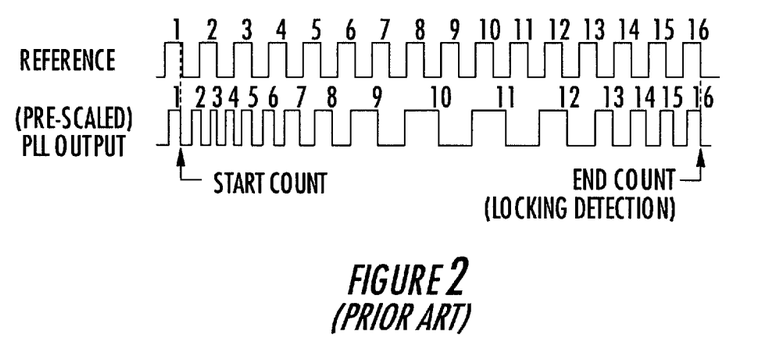
FIG. 2 depicts a possible mechanism of false detection of a phase lock condition in the circuit illustrated in FIG. 1.

As depicted in FIG. 2, the two counters, depending on the end count value carry out substantially an average on the effective value of the frequency. While the reference signal is stable (by definition), the signal generated by the PLL, suitably scaled, oscillates in frequency with a mean value detected from the associated counter. As a consequence, during the transient turn on phase, it may happen that the two counters are aligned, notwithstanding that the output signal of the PLL is unstable and should not be used by the application as a signal for timing and synchronizing all logic operations.

Figure 3:
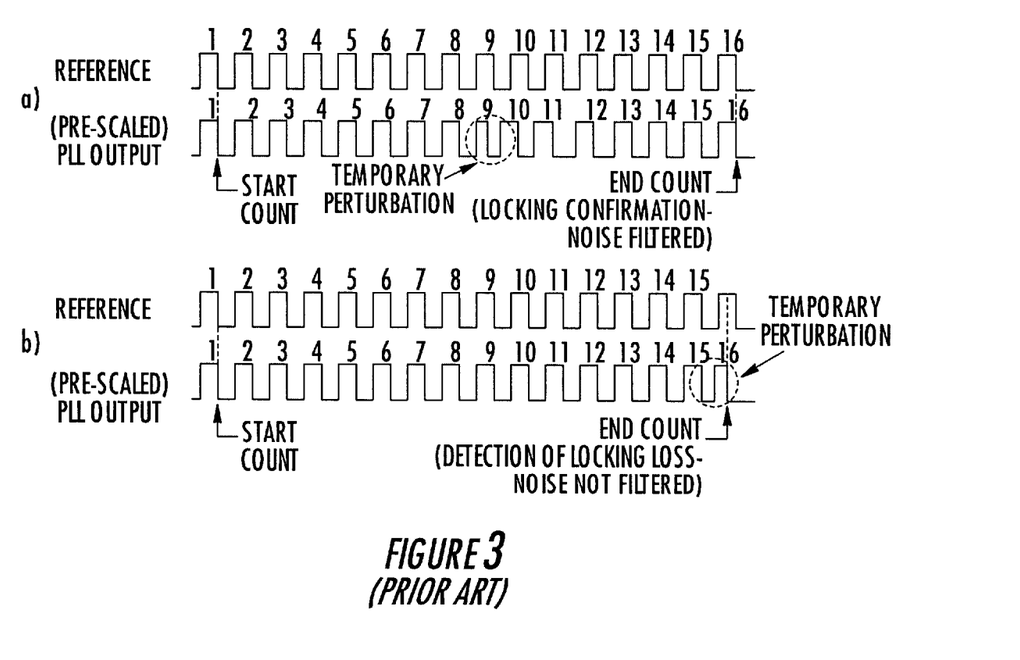
FIG. 3 depicts two possible effects that a momentary injection of noise may cause in the circuit illustrated in FIG. 1.

False Detection of a Loss of Locking:

Starting from a condition of locking, a perturbation may lead temporarily to a condition in which the output of the PLL differs (in frequency) from the expected value. The feed-back loop reacts immediately trying to compensate the variation, generating a slight overshoot. This temporary situation is in general filtered by the relative long length of the counting, as depicted in FIG. 3a. The probability that the injection of a disturbance takes place when the counters are almost at the end of a count is smaller as the period of counting is longer. Unfortunately, such a probability is never null. This implies that even a small disturbance, if injected at the moment when the two counters are almost terminating the counting, could make the filtering action of the counters ineffective. This causes the generation of a loss of a locking signal, as depicted in FIG. 3b.

Critical Choice of the End Count Signal:

The choice of the end count signal for the two counters determines the sensitivity of the detection circuit. If, on one hand, a short counting period ensures a most immediate reaction of the system to a perturbation of the equilibrium condition (locking). On the other hand, it makes the system excessively sensitive to occasional short lived events that could be neglected. Often, in some applications, the two opposite requirements have both a vital importance for the functionality of the whole system. For example, there is the need of reacting promptly to an eventual failure of the device that generates the frequency reference signal by triggering emergency routines. On the contrary, a momentary injection of high level noise may cause a temporary condition of a loss of locking that a system may be perfectly able to operate without triggering dedicated procedures for managing the event.

SUMMARY OF THE INVENTION

An object of the present invention is to overcome the above mentioned critical points and drawbacks of the known circuits for monitoring a phase-locked condition, and to provide an improved system for generating a clock signal based on a frequency stable reference signal.

The phase lock detecting circuit of the invention is based on the use of a resettable memory with a capacity (in terms of number of bits) sufficient to store a certain number of signals or logic values. These signals or logic values result from a sequence of as many successive comparisons of the values contained in the two counters of a common digital circuit for phase lock detection of the prior art, and of logic circuits for generating a certain logic signal confirming a locked condition upon the occurrence of an uninterrupted sequence of a certain number of logic signals all confirming a locked condition and a different logic signal. This is indicative of a loss of a lock condition upon the occurrence of an uninterrupted sequence of a certain number of logic signals having different values at the input of the resettable memory.

In other words, the circuit exploits a resettable memory suitable to register, at each end count of a common digital circuit for the detection of a phase lock condition of the prior art, the result of the comparison between the content of the two counters of the phase lock detection circuit. A confirmation signal of the detection of a phase lock condition or of a loss of a lock condition is provided to the system only after the memory has stored an uninterrupted series of identical signals either of locking or of loss of locking. The number of which may be pre-defined in the design stage or programmed by the user, even in a dynamically variable fashion depending on one or more operation parameters of the system, which are purposely monitored.

The depth of the resettable memory (that is, the number of successive comparisons that are required for confirming either a locking condition or a loss of a locking condition) may be set by the user himself. Moreover, the sensitivity of detection of a locked condition and of a loss of locking may be set even with different depths independently from one another, depending on the application, and the settings may even be dynamically modified to adapt to changing operating conditions.

The invention is more precisely defined in the annexed claims.

BRIEF DESCRIPTION OF THE DRAWINGS

The various aspects and advantages of the invention will be even more easily understood through the following detailed description and by referring to the attached drawings, wherein.

DETAILED DESCRIPTION OF THE PREFERRED EMBODIMENTS

With reference to the basic diagram of FIG. 4, the functioning of the circuit of the invention is described below. In the depicted example the resettable memory includes a resettable shift register (for instance, 8 bits). Any other storage structure for a certain number of bits (buffer), operating in a FIFO mode (first-in-first-out) and resettable at the end of each counting cycle, may be used instead of a shift register.

Figure 4:
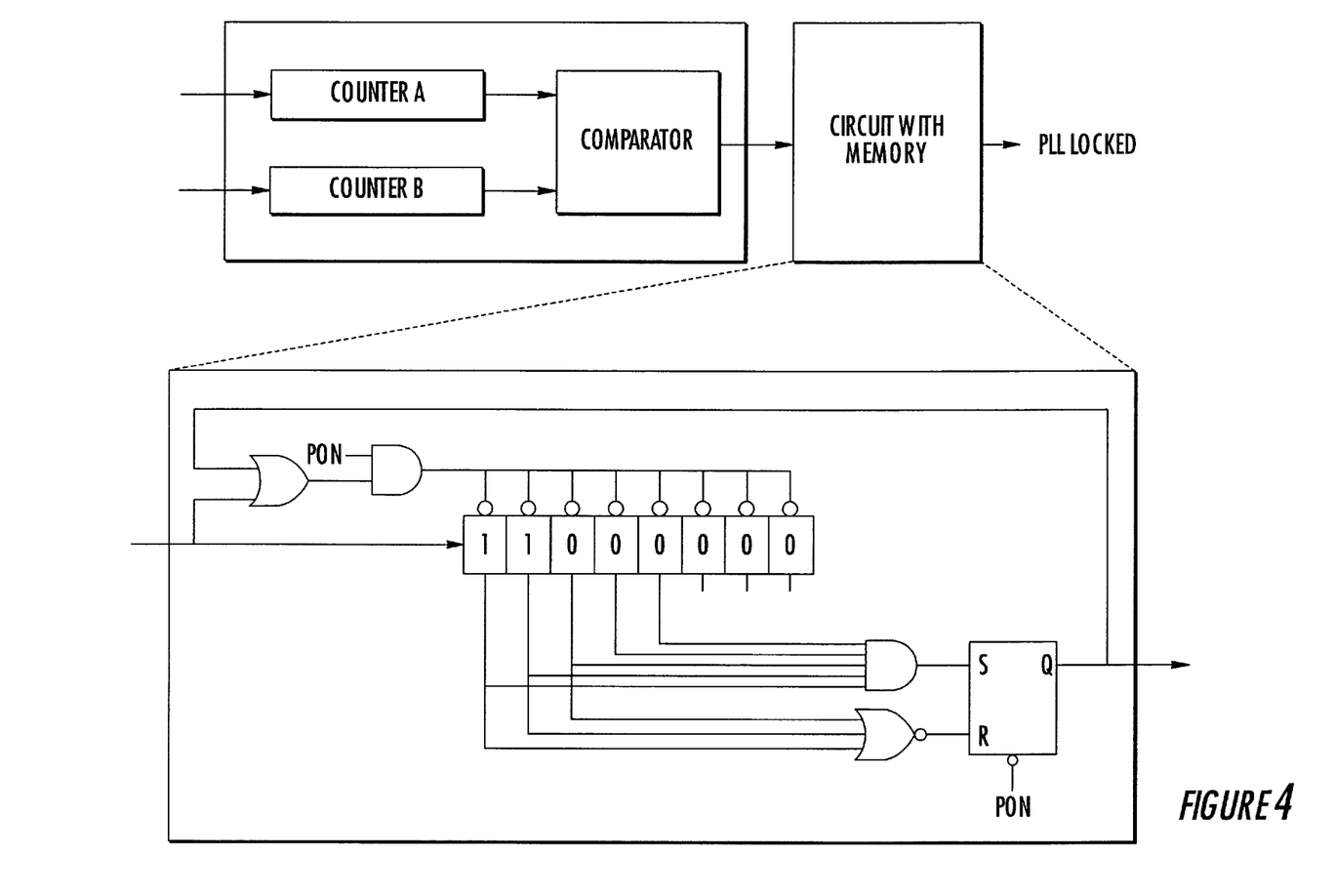
FIG. 4 is a basic diagram of the phase lock detection circuit according to the present invention.

Referring to FIG. 4, upon the turning on of the device (low PON signal–PON=Power–ON), all the bit cells are reset and the register outputs a signal that is not locked. When the supply voltage stabilizes, the signal PON is high and the shift register may be loaded.

Detection of the Locking Condition:

The counters A and B produce a succession of end counts, and a resulting sequence of comparisons. The logic data (bit) that results from each comparison is input to the shift register. When the two counters at an end count contain the same value, a logic 1 is stored in the shift register, otherwise a 0 is stored.

Whenever a logic 0 is input to the shift register, the whole register is reset. This allows restart of the accumulation sequence in order to eventually produce a signal of a verified phase locking only when the whole register (or at least the most significative portion of it, depending on the programming) is filled with a logic 1.

In this way, if events for equality of the contents of the two counters occurs, but soon followed by inequality events, the circuit filters these equality of counts occurrences by continuing to signal to the system that a not verified locking condition exists.

Only once the output signal of the PLL has attained a true stability, the phase lock detection circuit generates an uninterrupted sequence of a logic 1. This guarantees that the clock signal is finally valid, and that a steady state has been reached. The phase lock assertion signal is produced by ANDing a programmable number of bits of the shift register. Only when all the selected bits are logically all 1, the PLL is considered locked.

By referring to FIG. 4, the bistable stage (flip-flop or Set-Reset circuit) raises its output to the logic level 1, thus indicating to the system that operation may be started. In the example of FIG. 4, only 5 bits of the shift register are used (ANDed) for generating a phase lock assertion signal.

Detection of the Locking Loss:

Once the phase lock condition has been reached (the flip-flop or Set-Reset circuit having its output at a logic 1), should a disturbance determine an inequality event between the contents of the two counters at an end count cause the feeding of a logic 0 to the first element (bit cell) of the shift register, such a single inequality event will not change the state of the output of the detection circuit confirming a locked PLL condition.

Contrary to what happens during a phase of locking for the attainment of a phase lock condition, the inputting of a logic 0 does not cause a reset of the whole shift register. Only when all the significant bits in the shift register for the determination of the loss of the locking condition are a logic 0, the bistable output stage (flip-flop or Set-Reset circuit) is reset. This signals to the system a persistent loss of a phase lock condition that cannot be filtered any longer.

At this point the system returns to a state similar to that existing upon the turning on of the device (the shift register is reset). In the example of FIG. 4, only 3 bits are used to discriminate a situation of loss of locking, and generates the relative signal. Though retaining unchanged the structure of known phase lock detection circuits based on a pair of counters and on a comparator, the circuit of this invention overcomes the noted drawbacks of the known circuits.

In particular, the depth of the single counting assumes a relative importance. This is no longer an essential importance for the detection of the locking condition or of the loss of locking condition, by virtue of the crucial filtering function performed by the resettable memory (shift register).

The risk of considering locked the PLL by mistake, while in reality it is still evolving toward a steady state condition is completely eliminated (or at least its probability becomes negligible). Theoretically, this could still happen that the overshoots last long enough, producing a sequence of comparisons all with equalities between the contents of the two counters, but with the PLL not yet stabilized, thus prematurely asserting a phase-locked condition.

The risk of excessive sensitivity of the circuit in determining a loss of locking in case of momentary noise injections is practically prevented. The system is informed of a loss of locking only if the condition persists.

The flexibility enhancement is immediately recognizable because the independent programmability of the circuits for the detection of phase lock condition, and for the detection of the loss of phase lock allows the PLL to adapt even dynamically the sensitivity of the two circuits. This depends on the characteristics of the application, and of the environment in which the system operates (variability of temperature conditions, noise level, supply voltage, frequency, etc.).

The flexibility of the circuit of the invention may be fully exploited by associating to the base circuit, circuits for setting via software or even circuits for automatic regulation in a dynamic mode of the sensitivity of the detection and assertion circuits of a verified locking condition, and of a verified loss of a locking condition. The improved device of this invention may offer two enhanced modes.

These modes include software programmability and automatic regulation. Software programmability allows the user to define the number of countings that make up a detection sequence for a verified locking, and independently the number of countings that compose a detection sequence for a verified loss of locking. Automatic regulation is carried out as a function of the level of noise injection. To this end, particular operating conditions are identified for which the noise level on the internal supply rails is particularly high. This is confirmed by measuring an excessively high noise level on the supply lines of the analog section of the PLL.

Figure 5:
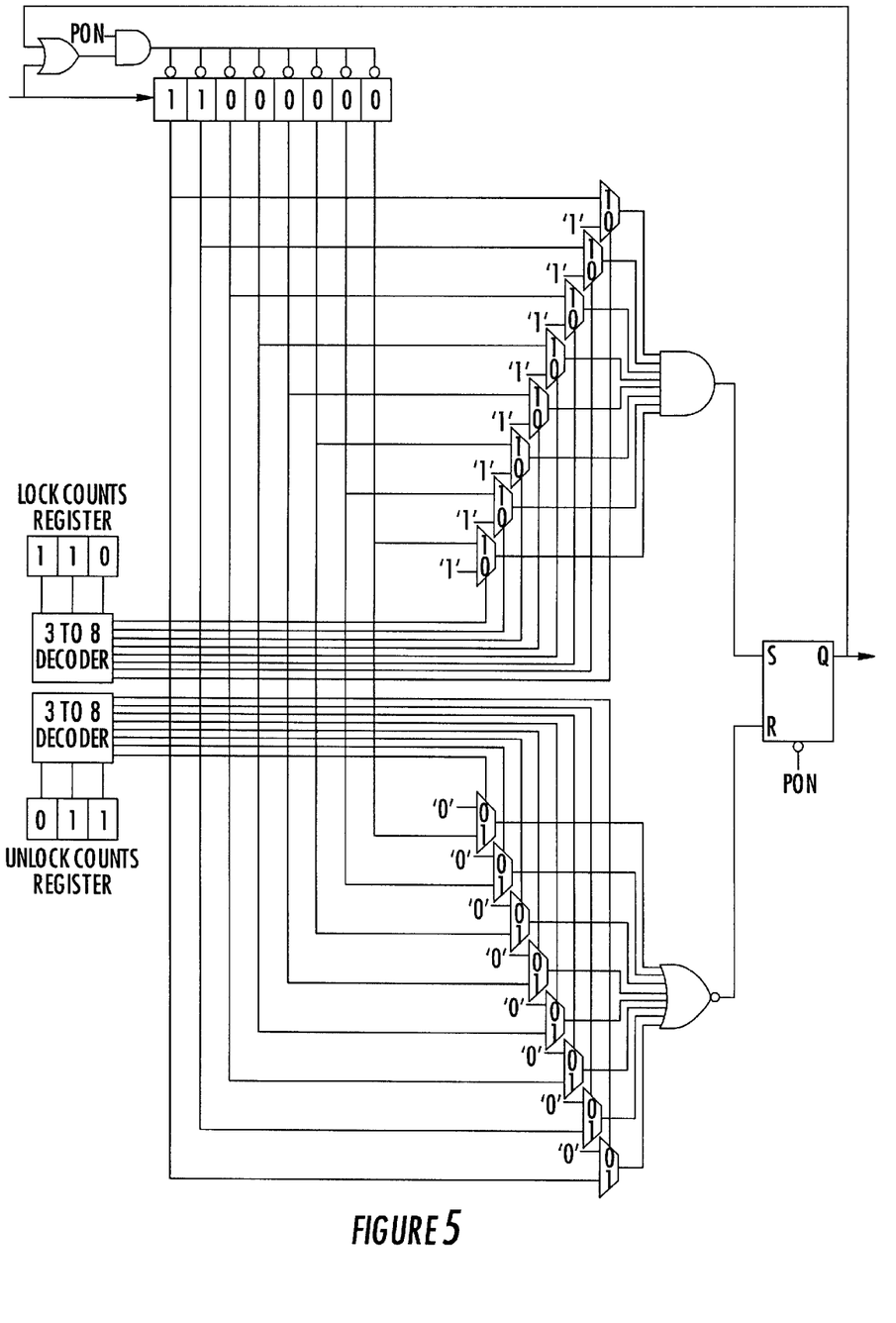
FIG. 5 is a basic diagram of implementing of software programmability for the sensitivity of the phase lock detection circuit according to the present invention.

Programmability Via Software of the Sensitivity of the Circuit:

FIG. 5 depicts the basic diagram of a circuit that allows programming of the sensitivity of the phase lock detection circuit in the PLL. Through respective registers, LOCK COUNTS REGISTER and UNLOCK COUNTS REGISTER, it is possible to program the minimum number (value) of respective consecutive counting cycles necessary for the assertion of a locking and of a locking loss. A minimum number is fixed because automatic regulation (if enabled) may increment dynamically the number of counting cycles for asserting a locking and for asserting a locking loss.

The default value of the program registers may be a hardware option defined in laying down the specification of the device, whereby at power on such a pre-defined minimum value is loaded in the register. The register is not reset at each reset, in order to retain, even during the reset phase, the parameters previously set by the user. The register is formed in a dedicated zone of a flash memory (non volatile). The default value is pre-defined at the test level of the product (in the factory), for being eventually redefined by the user. Even in this case, the pre-established parameters are retained even after a reset and even a power-on event does not affect the default values that are loaded in the non-volatile memory.

Obviously the minimum value that may be set is 1 counting cycle (0 would be insignificant). Respective decoders, a 3 to 8 decoder for example, of the number programmed in the two registers generate respective buses of logic values. Each bus has a number of lines corresponding to the number of logic signals (bits) that may be stored in the resettable memory, such as, in the shift register.

The multiplexers of a first array are controlled by the logic value present on the respective line of the bus that is produced depending on the value contained in the register LOCK COUNTS REGISTER. Each multiplexer has a first input to which is applied the logic signal corresponding to the value contained in a respective stage (bit) of the resettable shift register. A second input receives the logic signal having a value corresponding to the case of identity of the values contained in the two counters at an end count, and an output coupled to an input of a logic AND gate for driving the set input of the bistable output stage.

The multiplexers of a second array are controlled by the logic value present on a respective line of the bus that is produced depending on the value stored in the register UNLOCK COUNTS REGISTER, and each multiplexer has a first input to which the logic signal corresponding to the value stored in a respective stage (bit) of the resettable shift register is applied. A second input receives the logic signal having a value corresponding to the case of non-identity of values stored in the two counters at an end count. An output is coupled to an input of a logic NOR gate for driving the reset input of the bistable output circuit.

Automatic Dynamic Regulation:

Software programmability may sometimes be burdening in terms of the level of interrupt of the application, and even more it may not imply an immediate reaction of the system to unexpected noisy conditions unmanageable in a deterministic manner by the application. It is therefore particularly effective to enable the function of automatic regulation of the sensitivity parameters of the detection circuit for a locking and locking loss.

Figure 6:
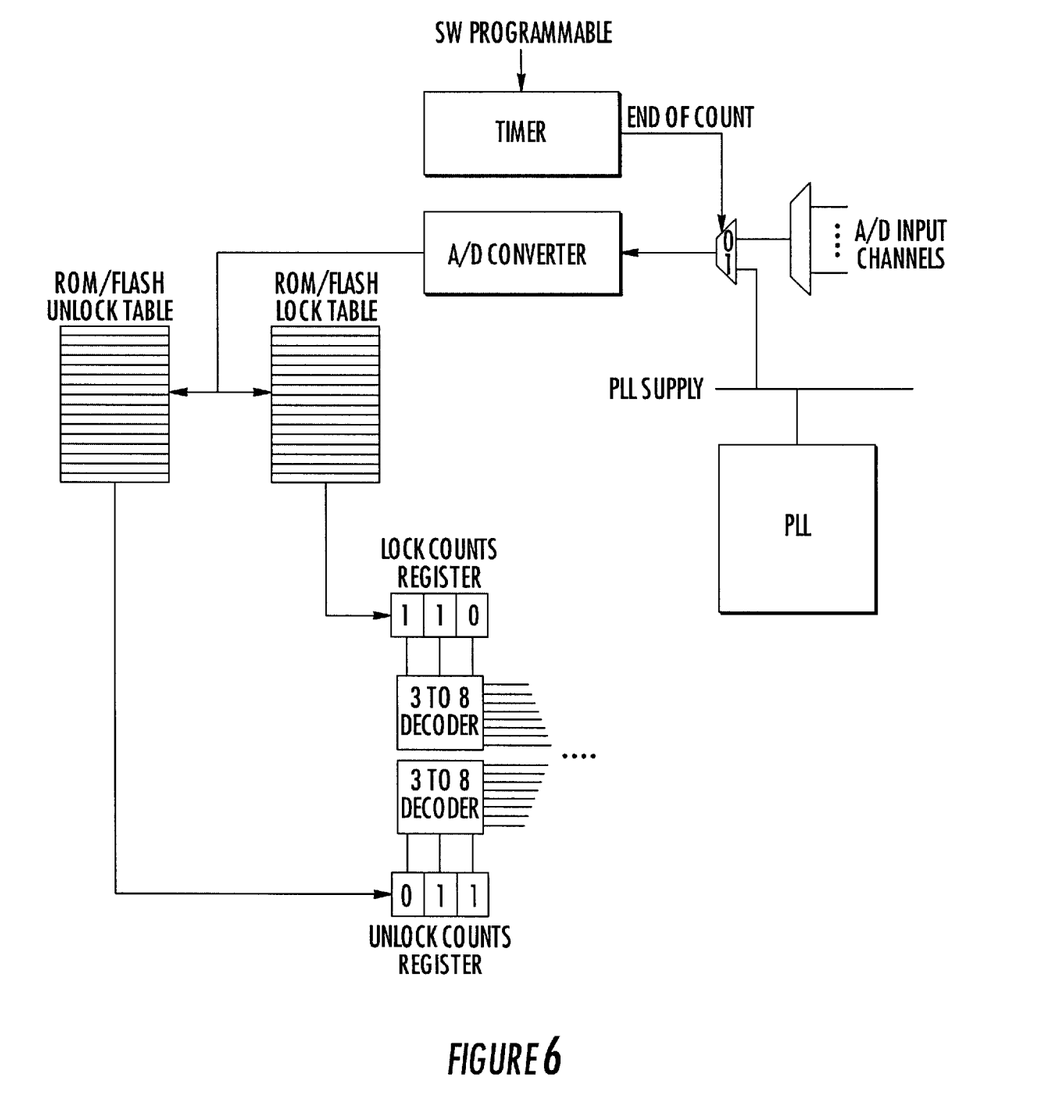
FIG. 6 is a basic diagram for automatically regulating the sensitivity of the phase lock detection circuit according to the present invention.

An effective implementation scheme of this function is depicted in FIG. 6. The circuit may be based, for instance, on monitoring (measuring) the instantaneous value of the supply voltage of the PLL circuit. A channel of an analog/digital converter A/D converter that may exist in the integrated device for other purposes may be periodically (period defined by a dedicated counter programmable by the user) assigned to measuring the supply voltage of the circuits of the PLL that are more sensitive to noise (for example, a Voltage Controlled Oscillator VCO).

The digital output of the converter is compared with respective look up tables: ROM/FLASH LOCK TABLE and ROM/FLASH UNLOCK TABLE, pre-defined and stored in a dedicated area of flash memory of the integrated device (pre-configured in the factory by the device manufacturer, but re-definable and controllable by the final user).

When certain thresholds are overcome, the value present in the registers lock counts register and unlock counts register that define the minimum number of successive counting cycles necessary for detecting a locking and a locking loss, is incremented or decremented depending on what is best suited to the situation.

In particular, the following functions are implemented. During a phase of searching for a phase lock condition an excessively high noise level could lead a system based on a relatively high number of successive countings to never assert a locking condition. Therefore, during this phase, the circuit that monitors the noise level may consent to progressively shortening the sequence of equality countings, as far as to obtain assertion of the attained locking. Of course, a minimum threshold will ensure that the system confirms an absence of locking in case of extreme operating conditions, which may include possible defects of the device that impede the generation of a stable reference frequency signal of the PLL.

Once the locking has been reached, in presence of relatively high noise levels, the sequence of successive countings for detecting a loss of locking is prolonged, in order to make the system less sensitive to disturbances that may be considered acceptable. Should the noise level decrease, the sequence is shortened in order for the system to regain sensitivity to sudden disturbances for preventing typical problems of de-synchronization of the serial communication channels (typically of CAN lines in automotive applications).

The above embodiment is particularly suited for applications wherein the noise level that is injected in the system from external circuits and/or generated in the device, often combine in a deterministic (expectable) manner (tied to the peculiarities of the application itself), and seldom in such a manner to produce generally unexpected effects.

This happens in automotive applications. Any electronic circuitry located in the engine compartment is subjected to a high noise levels when the engine is being started, noise that persists though changing its characteristics and intensity in the successive phases, such as when the engine is running, in acceleration/deceleration phases, in case of an impact (for instance an electronic circuitry (integrated system) for controlling the ABS, airbag, and the like).

When the engine is off, other circuitries continue their activity for a relatively long time, detecting and measuring signals coming from sensors of various kind and tracking the evolution in time of several parameters. Therefore, they operate in an environment that has become much less noisy but where many operations still require communication between distinct modules, and thus a good sensitivity and reactivity in case of unexpected events (such as, for instance, the turning on of the engine by the user).

In all these situations, the sensitivity of the system for generating a stable clock signal (system clock) assumes a vital importance for the proper functioning of the circuitries. In automotive applications this often implies safety of the driver and of the passengers.

Even the microprocessors that regulate the activity of the various systems are responsible for the generation of noise. In particular, the systems that control the opening and closing of the valves of the motor (typically by pulse width modulated or PWM signals) with relative synchronous power circuits. Another example are the devices that control small electric motors used in dashboard indicators. Even in this case they generate synchronous signals having non-negligible power, that may cause the injection of noise of relatively high level in the internal system (single integrated device) and also in the external system (car) that disturbs especially the analog circuits present on the same integrated device, among which the PLL is one of the most critical and sensitive.

The novel circuit of the invention provides an outstanding flexibility that may count on a software programmability for all the conditions that are fairly expected or that at least are manageable in terms of response times. The circuit may also count on automatic programmability whenever it is safer that the system regulates itself dynamically without intervention ofthe software that may thus continue in the execution of the main functions of the application that it is managing, without periodically interrupting itself for controlling the noise level and adjusting sensitivities.

That which is claimed is:

1. A digital circuit for detecting and asserting a phase lock condition of a phase locked loop (PLL) circuit, the digital circuit comprising:

a pair of counters respectively receiving a digital signal produced by the PLL circuit, and a digital reference signal that is also received by the PLL circuit;

a digital comparator connected to said pair of counters for comparing count values contained therein at an end of a counting cycle, and for generating a first logic signal when the count values are the same and a second logic signal when the count values are different;

a resettable memory receiving the logic signals generated by said digital comparator and having a capacity sufficient to store a plurality of the logic signals resulting from successive comparisons, said resettable memory comprising logic circuit means comprising a bistable output circuit that outputs a third logic signal for asserting a phase lock condition of the PLL circuit when an uninterrupted sequence of the first logic signals have been input to said resettable memory during the successive comparisons, and outputs a fourth logic signal for asserting a loss of a phase lock condition of the PLL circuit when an uninterrupted sequence of the second logic signals have been input to said resettable memory during the successive comparisons.

2. A detection circuit according to claim 1, wherein a number of the first logic signals provided by the successive comparisons for determining the phase lock condition, and a number of the second logic signals provided by the successive comparisons for determining the loss of a phase lock condition are independently programmable.

3. A detection circuit according to claim 1, wherein said resettable memory further comprises:

a multi-stage shift register comprising a plurality of stages;

a first logic circuit having inputs connected to a first number of stages in said multi-stage shift register, and an output for providing a first output signal based upon the most significant bits in the first number of stages; and a second logic circuit having inputs connected to a second number of stages in said multi-stage shift register, and an output for providing a second output signal based upon the most significant bits in the second number of stages;

wherein said bistable output circuit has a set input being driven by the first output signal and a reset input being driven by the second output signal.

4. A detection circuit according to claim 3, wherein said first logic circuit comprises an AND gate, and wherein said second logic circuit comprises a NOR gate.

5. A detection circuit according to claim 4, wherein said multi-stage shift register is reset to contain all zero bits based upon a logic OR of the logic signal generated by said digital comparator and an output signal from said bistable output circuit.

6. A detection circuit according to claim 5, wherein said multi-stage shift register and said bistable output circuit are reset when an integrated device containing the PLL circuit is powered on.

7. A detection circuit according to claim 2, wherein said logic circuit means comprises:

a first register programmed with the number of first logic signals to be provided by the successive comparisons for determining the phase lock condition;

a second register programmed with the number of second logic signals to be provided by the successive comparisons for determining the loss of a phase lock condition;

a first decoder having inputs connected to said first register, and a plurality of outputs defining a first bus having a number of lines corresponding to the number of bits stored in said resettable memory;

a second decoder having inputs connected to said second register, and a plurality of outputs defining a second bus having a number of lines corresponding to the number of bits stored in said resettable memory;

a logic AND gate having an output for driving a set input of said bistable output stage;

a first array of multiplexers controlled by a logic value present on said first bus, each multiplexer having a first input for receiving a logic signal corresponding to a value of a respective bit stored in said resettable memory, and a second input for receiving the first logic signal, and an output coupled to an input of said logic AND gate;

a logic NOR gate having an output for driving a reset input of said bistable output stage; and a second array of multiplexers controlled by a logic value present on said second bus, each multiplexer having a first input for receiving the logic signal corresponding to the value of the respective bit stored in said resettable memory, and an output coupled to an input of said logic NOR gate.

8. A detection circuit according to claim 7, further comprising:

measuring circuit means for measuring an instantaneous value of a supply voltage of the PLL circuit;

an analog/digital converter connected to said measuring circuit means for converting the measured instantaneous value of the supply voltage to a digital value;

first and second look-up tables having pre-defined and non-volatile recorded values of comparison for the digital value; and circuit means for incrementing or decrementing values stored in said first and second registers based upon a comparison of the digital value with the recorded values stored in the respective first and second look-up tables.

9. A digital circuit for detecting a phase lock condition of a phase locked loop (PLL) circuit, the digital circuit comprising:

a pair of counters respectively receiving a digital signal produced by the PLL circuit, and a digital reference signal that is also received by the PLL circuit;

a digital comparator connected to said pair of counters for comparing count values contained therein at an end of a counting cycle, and for generating a first logic signal when the count values are the same and a second logic signal when the count values are different; and a resettable memory receiving the logic signals generated by said digital comparator and having a capacity sufficient to store a plurality of the logic signals resulting from successive comparisons, said resettable memory generating a third logic signal for asserting a phase lock condition of the PLL circuit when an uninterrupted sequence of the first logic signals have been input to said resettable memory during the successive comparisons, and generating a fourth logic signal for asserting a loss of a phase lock condition of the PLL circuit when an uninterrupted sequence of the second logic signals have been input to said resettable memory during the successive comparisons.

10. A detection circuit according to claim 9, wherein a number of the first logic signals provided by the successive comparisons for determining the phase lock condition, and a number of the second logic signals provided by the successive comparisons for determining the loss of a phase lock condition are independently programmable.

11. A detection circuit according to claim 9, wherein said resettable memory comprises:

a multi-stage shift register comprising a plurality of stages;

a first logic circuit having inputs connected to a first number of stages in said multi-stage shift register, and an output for providing a first output signal based upon the most significant bits in the first number of stages;

a second logic circuit having inputs connected to a second number of stages in said multi-stage shift register, and an output for providing a second output signal based upon the most significant bits in the second number of stages; and a bistable output circuit having an input being driven by the first output signal, and a reset input being driven by the second output signal.

12. A detection circuit according to claim 11, wherein said first logic circuit comprises an AND gate, and wherein said second logic circuit comprises a NOR gate.

13. A detection circuit according to claim 11, wherein said multi-stage shift register is reset to contain all zero bits based upon a logic OR of the logic signal generated by said digital comparator and an output signal from said bistable output circuit.

14. A detection circuit according to claim 11, wherein said multi-stage shift register and said bistable output circuit are reset when an integrated device containing the PLL circuit is powered on.

15. A detection circuit according to claim 11, wherein said resettable memory comprises:
 a first register programmed with a number of first logic signals to be provided by the successive comparisons for determining the phase lock condition;
 a second register programmed with a number of second logic signals to be provided by the successive comparisons for determining the loss of a phase lock condition;
 a first decoder having inputs connected to said first register, and a plurality of outputs defining a first bus having a number of lines corresponding to the number of bits stored in said resettable memory;
 a second decoder having inputs connected to said second register, and a plurality of outputs defining a second bus having a number of lines corresponding to the number of bits stored in said resettable memory;
 a logic AND gate having an output for driving a set input of said bistable output circuit;
 a first array of multiplexers controlled by a logic value present on said first bus, each multiplexer having a first input for receiving a logic signal corresponding to a value of a respective bit stored in said resettable memory, and a second input for receiving the first logic signal, and an output coupled to an input of said logic AND gate;
 a logic NOR gate having an output for driving a reset input of said bistable output circuit; and
 a second array of multiplexers controlled by a logic value present on said second bus, each multiplexer having a first input for receiving the logic signal corresponding to the value of the respective bit stored in said resettable memory, and an output coupled to an input of said logic NOR gate.

16. A detection circuit according to claim 15, further comprising:
 a measuring circuit for measuring an instantaneous value of a supply voltage of the PLL circuit;
 an analog/digital converter connected to said measuring circuit for converting the measured instantaneous value of the supply voltage to a digital value;
 first and second look-up tables having pre-defined and non-volatile recorded values of comparison for the digital value; and
 a circuit for incrementing or decrementing values stored in said first and second registers based upon a comparison of the digital value with the recorded values stored in the respective first and second look-up tables.

17. An integrated circuit comprising:
 a phase locked loop (PLL) circuit; and
 a digital circuit for detecting a phase lock condition of said PLL circuit, said digital circuit comprising a pair of counters respectively receiving a digital signal produced by said PLL circuit, and a digital reference signal that is also received by the PLL circuit,
 a digital comparator connected to said pair of counters for comparing count values contained therein at an end of a counting cycle, and for generating a first logic signal when the count values are the same and a second logic signal when the count values are different, and
 a resettable memory receiving the logic signals generated by said digital comparator and having a capacity sufficient to store a plurality of the logic signals resulting from successive comparisons, said resettable memory generating a third logic signal for asserting a phase lock condition of said PLL circuit when an uninterrupted sequence of the first logic signals have been input to said resettable memory during the successive comparisons, and generating a fourth logic signal for asserting a loss of a phase lock condition of said PLL circuit when an uninterrupted sequence of the second logic signals have been input to said resettable memory during the successive comparisons.

18. An integrated circuit according to claim 17, wherein a number of the first logic signals provided by the successive comparisons for determining the phase lock condition, and a number of the second logic signals provided by the successive comparisons for determining the loss of a phase lock condition are independently programmable.

19. An integrated circuit according to claim 17, wherein said resettable memory comprises:
 a multi-stage shift register comprising a plurality of stages;
 a first logic circuit having inputs connected to a first number of stages in said multi-stage shift register, and an output for providing a first output signal based upon the most significant bits in the first number of stages;
 a second logic circuit having inputs connected to a second number of stages in said multi-stage shift register, and an output for providing a second output signal based upon the most significant bits in the second number of stages; and
 a bistable output circuit having an input being driven by the first output signal, and a reset input being driven by the second output signal.

20. An integrated circuit according to claim 19, wherein said first logic circuit comprises an AND gate, and wherein said second logic circuit comprises a NOR gate.

21. An integrated circuit according to claim 20, wherein said multi-stage shift register is reset to contain all zero bits based upon a logic OR of the logic signal generated by said digital comparator and an output signal from said bistable output circuit.

22. An integrated circuit according to claim 19, wherein said multi-stage shift register and said bistable output circuit are reset when the integrated circuit is powered on.

23. An integrated circuit according to claim 19, wherein said resettable memory comprises:
 a first register programmed with a number of first logic signals to be provided by the successive comparisons for determining the phase lock condition;
 a second register programmed with a number of second logic signals to be provided by the successive comparisons for determining the loss of a phase lock condition;
 a first decoder having inputs connected to said first register, and a plurality of outputs defining a first bus having a number of lines corresponding to the number of bits stored in said resettable memory;

a second decoder having inputs connected to said second register, and a plurality of outputs defining a second bus having a number of lines corresponding to the number of bits stored in said resettable memory;

a logic AND gate having an output for driving a set input of said bistable output circuit;

a first array of multiplexers controlled by a logic value present on said first bus, each multiplexer having a first input for receiving a logic signal corresponding to a value of a respective bit stored in said resettable memory, and a second input for receiving the first logic signal, and an output coupled to an input of said logic AND gate;

a logic NOR gate having an output for driving a reset input of said bistable output circuit; and a second array of multiplexers controlled by a logic value present on said second bus, each multiplexer having a first input for receiving the logic signal corresponding to the value of the respective bit stored in said resettable memory, and an output coupled to an input of said logic NOR gate.

24. An integrated circuit according to claim 23, wherein said detection circuit further comprises:

a measuring circuit for measuring an instantaneous value of a supply voltage of the PLL circuit;

an analog/digital converter connected to said measuring circuit for converting the measured instantaneous value of the supply voltage to a digital value;

first and second look-up tables having pre-defined and non-volatile recorded values of comparison for the digital value; and a circuit for incrementing or decrementing values stored in said first and second registers based upon a comparison of the digital value with the recorded values stored in the respective first and second look-up tables.

25. A method for detecting a phase lock condition of a phase locked loop (PLL) circuit using a digital circuit comprising a pair of counters respectively receiving a digital signal produced by the PLL circuit, and a digital reference signal that is also received by the PLL circuit; a digital comparator connected to the pair of counters; and a resettable memory connected to the digital comparator and having a capacity sufficient to store a plurality of the logic signals resulting from successive comparisons, the method comprising:

comparing count values in the pair of counters at an end of a counting cycle, and generating a first logic signal at an output of the comparator when the count values are the same and a second logic signal at the output of the comparator when the count values are different;

storing in the resettable memory the logic signals generated by the digital comparator; and generating a third logic signal for asserting a phase lock condition of the PLL circuit when an uninterrupted sequence of the first logic signals have been input to the resettable memory during the successive comparisons, and generating a fourth logic signal for asserting a loss of a phase lock condition of the PLL circuit when an uninterrupted sequence of the second logic signals have been input to the resettable memory during the successive comparisons.

26. A method according to claim 25, further comprising monitoring logic values of a selected number of significant bits in the resettable memory; and wherein the third and fourth logic signals are generated based upon the monitored logic vales.

27. A method according to claim 25, wherein a number of the first logic signals provided by the successive comparisons for determining the phase lock condition, and a number of the second logic signals provided by the successive comparisons for determining the loss of a phase lock condition are independently programmable.

28. A method according to claim 27, wherein the resettable memory comprises:

a multi-stage shift register comprising a plurality of stages;

a first logic circuit having inputs connected to a first number of stages in the multi-stage shift register, and an output for providing a first output signal based upon the most significant bits in the first number of stages; and a second logic circuit having inputs connected to a second number of stages in the multi-stage shift register, and an output for providing a second output signal based upon the most significant bits in the second number of stages; and a bistable output circuit having an input being driven by the first output signal, and a reset input being driven by the second output signal.

29. A method according to claim 28, wherein the first logic circuit comprises an AND gate, and wherein the second logic circuit comprises a NOR gate.

30. A method according to claim 29, wherein the multi-stage shift register is reset to contain all zero bits based upon a logic OR of the logic signal generated by the digital comparator and an output signal from the bistable output circuit.

31. A method according to claim 28, further comprising resetting the multi-stage shift register and the bistable output circuit when an integrated device containing the PLL circuit is powered on.

* * * * *